(12) United States Patent
Suh et al.

(10) Patent No.: US 8,916,898 B2
(45) Date of Patent: Dec. 23, 2014

(54) WAFER LEVEL LED PACKAGE AND METHOD OF FABRICATING THE SAME

(71) Applicant: Seoul Viosys Co., Ltd., Danwon-gu, Gyeonggi-do (KR)

(72) Inventors: Daewoong Suh, Ansan-si (KR); Chung Hoon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/074,098

(22) Filed: Nov. 7, 2013

(65) Prior Publication Data

US 2014/0061709 A1    Mar. 6, 2014

Related U.S. Application Data

(62) Division of application No. 13/359,287, filed on Jan. 26, 2012, now Pat. No. 8,592,232.

(30) Foreign Application Priority Data

Jan. 28, 2011 (KR) .......................... 10-2011-0008736

(51) Int. Cl.
*H01L 33/44* (2010.01)
*H01L 33/62* (2010.01)
*H01L 33/20* (2010.01)
*H01L 33/48* (2010.01)
*H01L 33/50* (2010.01)

(52) U.S. Cl.
CPC ................ *H01L 33/44* (2013.01); *H01L 33/62* (2013.01); *H01L 33/20* (2013.01); *H01L 33/486* (2013.01); *H01L 33/50* (2013.01); *H01L 2933/0041* (2013.01); *H01L 2933/0066* (2013.01); *H01L 2924/0002* (2013.01)
USPC ........................................... 257/98

(58) Field of Classification Search
USPC ........................................... 257/98
See application file for complete search history.

(56) References Cited

U.S. PATENT DOCUMENTS

| 5,886,383 A | 3/1999 | Kinzer |
| 6,423,561 B1 | 7/2002 | Chino et al. |

(Continued)

FOREIGN PATENT DOCUMENTS

| JP | 2002-118293 | 4/2002 |
| JP | 2005-268431 | 9/2005 |

(Continued)

OTHER PUBLICATIONS

Non-Final Office Action issued on Apr. 15, 2013 in U.S. Appl. No. 13/359,287.

(Continued)

*Primary Examiner* — Thao P Le
(74) *Attorney, Agent, or Firm* — H.C. Park & Associates, PLC

(57) ABSTRACT

Disclosed are a light emitting diode (LED) package and a method of fabricating the same. The LED package includes a first substrate, a semiconductor stack disposed on a front surface of the first substrate, a second substrate including a first lead electrode and a second lead electrode, a plurality of connectors electrically connecting the semiconductor stack to the first and second lead electrodes, and a wavelength converter covering a rear surface of the first substrate. The semiconductor stack includes a first semiconductor layer, a second semiconductor layer, and an active layer disposed between the first semiconductor layer and the second semiconductor layer.

13 Claims, 7 Drawing Sheets

(56) References Cited

U.S. PATENT DOCUMENTS

| | | |
|---|---|---|
| 6,706,546 B2 * | 3/2004 | Yoshimura et al. ............. 438/31 |
| 6,870,223 B2 | 3/2005 | Kumagai et al. |
| 7,442,963 B2 | 10/2008 | Yamazaki et al. |
| 2002/0164268 A1 | 11/2002 | Salonen |
| 2003/0094683 A1 | 5/2003 | Poo et al. |
| 2003/0209722 A1 * | 11/2003 | Hatakoshi et al. ............. 257/98 |
| 2004/0188669 A1 * | 9/2004 | Atanackovic et al. .......... 257/15 |
| 2005/0194898 A1 | 9/2005 | Kharrazi-Olsson et al. |
| 2005/0211997 A1 | 9/2005 | Suehiro et al. |
| 2005/0253113 A1 | 11/2005 | Letz et al. |
| 2006/0102915 A1 | 5/2006 | Kim |
| 2006/0113598 A1 | 6/2006 | Chen et al. |
| 2006/0258028 A1 | 11/2006 | Paolini et al. |
| 2006/0261364 A1 | 11/2006 | Suehiro et al. |
| 2007/0138494 A1 | 6/2007 | Pugh et al. |
| 2008/0006837 A1 | 1/2008 | Park et al. |
| 2008/0035942 A1 | 2/2008 | Kim et al. |
| 2008/0074029 A1 * | 3/2008 | Suehiro ........................ 313/487 |
| 2008/0272712 A1 | 11/2008 | Jalink et al. |
| 2009/0072263 A1 | 3/2009 | Paolini et al. |
| 2009/0140272 A1 | 6/2009 | Beeson et al. |
| 2009/0159918 A1 | 6/2009 | Keller et al. |
| 2009/0291518 A1 | 11/2009 | Kim et al. |
| 2010/0140640 A1 | 6/2010 | Shimokawa et al. |
| 2010/0187556 A1 | 7/2010 | Kim et al. |
| 2010/0213607 A1 | 8/2010 | Smeys et al. |
| 2011/0018011 A1 | 1/2011 | Beeson et al. |
| 2011/0256648 A1 | 10/2011 | Kelley et al. |
| 2011/0278627 A1 | 11/2011 | Kim et al. |
| 2012/0003484 A1 | 1/2012 | Roehrig et al. |
| 2012/0040479 A1 | 2/2012 | Kim et al. |
| 2012/0228670 A1 | 9/2012 | Saito |
| 2013/0264600 A1 * | 10/2013 | Lee et al. ........................ 257/98 |

FOREIGN PATENT DOCUMENTS

| | | |
|---|---|---|
| JP | 2010-141176 | 6/2010 |
| KR | 10-2006-0095271 | 8/2006 |

OTHER PUBLICATIONS

Notice of Allowance issued on Aug. 22, 2013 in U.S. Appl. No. 13/359,287.

* cited by examiner

WAFER LEVEL LED PACKAGE AND METHOD OF FABRICATING THE SAME

CROSS-REFERENCE TO RELATED APPLICATIONS

This application is a divisional of U.S. patent application Ser. No. 13/359,287, filed on Jan. 26, 2012, and claims priority from and the benefit of Korean Patent Application No. 10-2011-0008736, filed on Jan. 28, 2011, which are hereby incorporated by reference for all purposes as if fully set forth herein.

BACKGROUND

1. Field

Exemplary embodiments of the present invention relate to a light emitting diode (LED) package and a method of fabricating the same, and more particularly, to a wafer level LED package and a method of fabricating the same.

2. Discussion of the Background

LEDs may be fabricated to be lightweight and slim, and may save energy and have a long lifespan. Accordingly, such LEDs have been widely used as backlight units for a variety of display devices, including mobile phones. LED packages with LEDs mounted thereon, may realize white light having a high color rendering index. Hence, LEDs have replaced white light sources, such as fluorescent lamps, and have been applied to general illumination.

Generally, a conventional LED package is fabricated by mounting individual LED chips on a package having lead electrodes, connecting the LED chips to the lead electrodes using bonding wires, and encapsulating the LED chips using an encapsulant.

In such a conventional method of fabricating an LED package, the LED chips are handled individually. Thus, a lot of time and expense are required for the mass production of LED packages, leading to lower productivity. Furthermore, since the bonding wires are formed again after the LED chips are mounted, the process of fabricating the LED package is complicated. In addition, since the wire bonding process using capillaries requires a space for movement of the capillaries, it acts as a limitation to reducing a package size. Moreover, package failure may be frequently caused by a bonding failure or disconnection of wires.

As a size of a growth substrate for growing an epitaxial layer has recently been increased from 2 inches to 4 inches, even up to 6 inches, thousands to ten thousands of LED chips have been fabricated on a single growth substrate. Therefore, there are increasing demands for fabricating LED packages in large quantities and rapidly by using those LED chips. However, the prior art has difficulty in meeting the above-described demands.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide an LED package, which is suitable for mass production through a simplified process, and a method of fabricating the same.

Exemplary embodiments of the present invention also provide an LED package, which is suitable for miniaturization, and a method of fabricating the same.

Exemplary embodiments of the present invention also provide an LED package, which is structurally stable, and a method of fabricating the same.

Exemplary embodiments of the present invention also provide an LED package, which is suitable for realizing mixed color light, particularly white light, and a method of fabricating the same.

Additional features of the invention will be set forth in the description which follows, and in part will be apparent from the description, or may be learned by practice of the invention.

An exemplary embodiment of the present invention provides a method of fabricating an LED package. The method includes forming a plurality of semiconductor stacks on a first substrate, each of the semiconductor stacks comprising a first semiconductor layer, a second semiconductor layer, and an active region disposed between the first semiconductor layer and the second semiconductor layer; coupling the plurality of semiconductor stacks to a second substrate, the second substrate comprising first lead electrodes and second lead electrodes arranged corresponding to the plurality of semiconductor stacks; and cutting the first substrate and the second substrate into a plurality of packages after the coupling is completed.

Another exemplary embodiment of the present invention provides a wafer level LED package. The wafer level LED package includes a first substrate; a semiconductor stack disposed on a front surface of the first substrate, the semiconductor stack comprising a first semiconductor layer, a second semiconductor layer, and an active layer disposed between the first semiconductor layer and the second semiconductor layer; a second substrate comprising a first lead electrode and a second lead electrode; a plurality of connectors electrically connecting the semiconductor stack to the first and second lead electrodes; and a wavelength converter covering a rear surface of the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
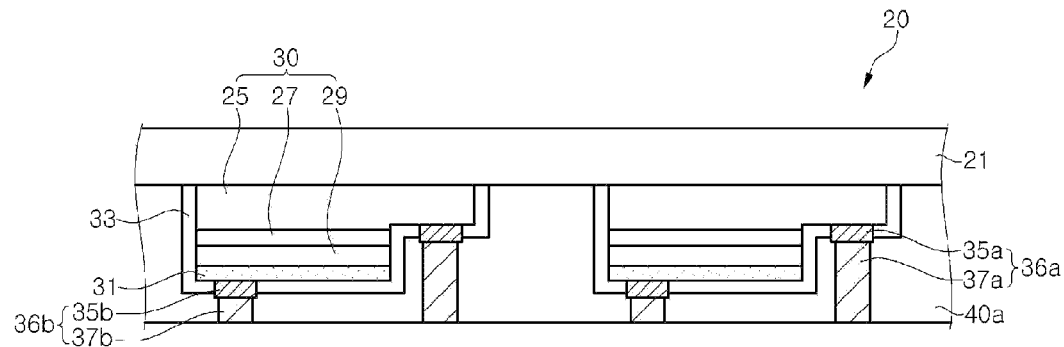
FIG. 1, FIG. 2, FIG. 3, FIG. 4, FIG. 5, FIG. 6, and FIG. 7 are cross-sectional views illustrating a method of fabricating an LED package according to an exemplary embodiment of the present invention.

Exemplary embodiments of the present invention will be described below in detail with reference to the accompanying drawings. These embodiments are provided so that this disclosure will be thorough and complete, and will fully convey the scope of the invention to those skilled in the art. The invention may, however, be embodied in many different forms and should not be construed as being limited to the embodiments set forth herein. In the drawings, the widths, lengths and thicknesses of elements may be exaggerated for clarity. Throughout the drawings and written description, like reference numerals will be used to refer to like elements.

It will be understood that when an element, such as a layer, a region, or a substrate, is referred to as being "on," "connected to," or "coupled to" another element, it may be directly on, connected or coupled to the other element, or intervening elements may be present. In contrast, when an element or layer is referred to as being "directly on," "directly connected to," or "directly coupled to," another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIGS. 1 to 7 are cross-sectional views illustrating a method of fabricating an LED package according to an exemplary embodiment of the present invention.

(Preparation of Wafer 20)

Referring to FIG. 1, a wafer 20, in which a plurality of semiconductor stacks 30 are formed on a first substrate 21, is prepared.

The wafer 20 includes the first substrate 21, and the plurality of semiconductor stacks 30 arranged on the first substrate 21. In addition, the wafer 20 may further include an ohmic contact layer 31, an insulation layer 33, first electrodes 36a, second electrodes 36b, an underfill 40a, and a buffer layer (not shown). Each of the semiconductor stacks 30 may include a first-conductivity-type semiconductor layer 25, an active layer 27, and a second-conductivity-type semiconductor layer 29. In addition, each first electrode 36a may include a first electrode pad 35a and a first bump 37a, and each second electrode 36b may include a second electrode pad 35b and a second bump 37b.

The first substrate 21 may be a growth substrate capable of growing a nitride semiconductor layer. For example, the first substrate 21 may be a sapphire substrate, a silicon carbide substrate, or a spinel substrate. The first substrate 21 is a transparent substrate capable of transmitting light.

The semiconductor stacks 30 may be fabricated through a typical LED chip fabricating process. That is, epitaxial layers, which include the first-conductivity-type semiconductor layer 25, the active layer 27, and the second-conductivity-type semiconductor layer 29, are grown on the first substrate 21 and are patterned to form the plurality of semiconductor stacks 30 on the first substrate 21. In order to expose a portion of the first-conductivity-type semiconductor layer 25, the second-conductivity-type semiconductor layer 29 and the active layer 27 may also be partially removed.

The active layer 27, the first-conductivity-type semiconductor layer 25, and the second-conductivity-type semiconductor layer 29 may be formed of group III-N compound semiconductors, for example, (Al, Ga, In)N semiconductors. The first-conductivity-type semiconductor layer 25 and the second-conductivity-type semiconductor layer 29 may each be single layer or multiple-layer. For example, the first-conductivity-type semiconductor layer 25 and/or the second-conductivity-type semiconductor layer 29 may include a contact layer and a clad layer. In addition, the first-conductivity-type semiconductor layer 25 and/or the second-conductivity-type semiconductor layer 29 may include a superlattice layer. Moreover, the active layer 27 may have a single quantum well structure or a multiple quantum well structure. For example, the first conductivity type may be an n type and the second conductivity type may be a p type; however, the invention is not limited thereto. The first conductivity type may be a p type and the second conductivity type may be an n type. The buffer layer (not shown) alleviates a lattice mismatch between the first substrate 21 and the first-conductivity-type semiconductor layer 25, leading to a reduction in defect density occurring within the semiconductor layers 25, 27, and 29.

Meanwhile, the ohmic contact layer 31 may be formed on the second-conductivity-type semiconductor layer 29. The first electrode pad 35a and the second electrode pad 35b may be formed on the first-conductivity-type semiconductor layer 25 and the second-conductivity-type semiconductor layer 29, respectively. For example, the ohmic contact layer 31 may include a transparent conductive layer, such as Ni/Au, indium tin oxide (ITO), indium zinc oxide (IZO), or ZnO; however, the invention is not limited thereto. The ohmic contact layer 31 may include a reflective metal layer. The first electrode pad 35a and the second electrode pad 35b may include one or more materials selected from Ti, Cu, Ni, Al, Au, and Cr. The second electrode pad 35b may be electrically connected to the second-conductivity-type semiconductor layer 29 through the ohmic contact layer 31. Before the first and second electrode pads 35a and 35b are formed, the insulation layer 33 covering the semiconductor stacks 30 may also be formed. The insulation layer 33 may be formed of silicon oxide or silicon nitride.

Furthermore, the first bump 37a and the second bump 37b may be formed on the first electrode pad 35a and the second electrode pad 35b, respectively. The first bump 37a and the second bump 37b are connectors that electrically connect the plurality of semiconductor stacks 30 to a first lead electrode 53a and a second lead electrode 53b of a second substrate 51. The first bump 37a and the second bump 37b structurally connect the plurality of semiconductor stacks 30 to the second substrate 51.

The first bump 37a and the second bump 37b may be formed of Au or a solder. Alternatively, after a bump is formed of a rigid metal such as Ni or Ni alloy, Au or a solder may be formed on the bump. In addition, the first bump 37a and the second bump 37b may be formed of a stud bump using a wire bonding technique.

Meanwhile, the underfill 40a may be formed on the first substrate 21, on which the semiconductor stacks 30 are formed. The underfill 40a may be formed of a thermosetting resin or a thermoplastic resin. In addition, the underfill 40a may include a phosphor and/or a filler. The phosphor may be added for converting a wavelength of light emitted toward the lateral sides of the semiconductor stacks 30, and the filler may be added for adjusting a coefficient of thermal expansion and a modulus of elasticity of the underfill 40a. For example, the underfill 40a may be formed using a spin coating or lamination technique. For example, the underfill 40a may be formed using a screen printing technique employing a squeeze. Accordingly, the underfill 40a may be formed to cover the lateral sides and the top surfaces of the semiconductor stacks 30. The first and second bumps 37a and 37b may pass through the underfill 40a and be exposed to the outside.

The underfill 40a may be cured in the step of preparing the wafer 20; however, the invention is not limited thereto. The underfill 40a may remain in a B-stage state in the step of preparing the wafer 20. Thereafter, while bonding the first and second bumps 37a and 37b to the lead electrodes 53a and 53b of the second substrate 21, the B-stage underfill 40a may be cured.

(Preparation of Package Member 50)

Figure 2:
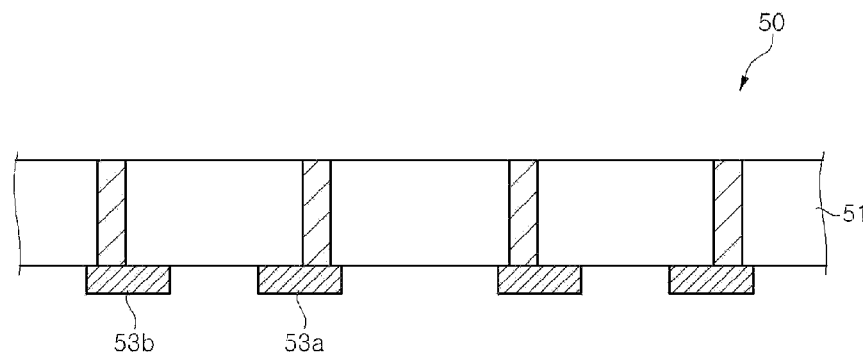

Referring to FIG. 2, the second substrate 51 including the first lead electrodes 53a and the second lead electrodes 53b is prepared as a package member 50.

The second substrate 51 may be a printed circuit board (PCB) on which the lead electrodes 53a and 53b are printed. For example, the second substrate 51 may be an organic PCB such as an FR4 PCB, a metal PCB, a metal core PCB, a ceramic substrate, a Si substrate, an AlN substrate, or a SiC substrate.

In a case where the second substrate 51 is a conductive substrate such as a metal PCB, the lead electrodes 53a and 53b may be insulated from the conductive substrate by an insulation layer (not shown).

The first and second lead electrodes 53a and 53b may have internal terminals or pads on the second substrate 51, and may have external terminals under the second substrate 51 in order for connection to an external power supply. The first and second lead electrodes 53a and 53b pass through the second substrate 51. The first and second lead electrodes 53a and 53b may fill through-holes of the second substrate 51; however, the invention is not limited thereto. The first and second lead electrodes 53a and 53b may be formed along the lateral sides of the through-holes.

(Coupling of Wafer 20 and Package Member 50)

Figure 3:
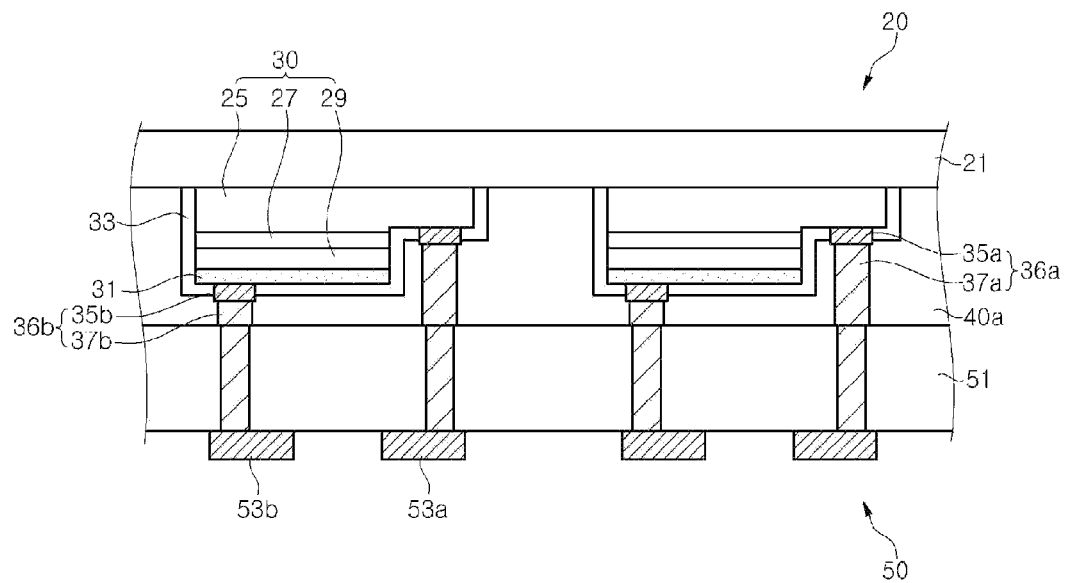

Referring to FIG. 3, the first bumps 37a and the second bumps 37b are bonded to the first lead electrodes 53a and the second lead electrodes 53b, respectively. The first and second bumps 37a and 37b may be bonded to the first and second lead electrodes 53a and 53b using a bonding technique, such as a thermocompression bonding, a thermosonic bonding, or a reflow. For the bonding, metal pads such as Au may be formed on the second substrate 51. In addition, a solder paste may be additionally formed on the metal pads.

Meanwhile, for example, in a case where the first and second bumps 37a and 37b are bonded by a thermocompression bonding, a temperature profile of a thermocompression bonding process may be adjusted to reduce a viscosity of the B-stage underfill 40a when a metal bonding is in progress, causing the B-stage underfill 40a to flow. Thereafter, while a temperature is maintained or decreased, a process of curing the B-stage underfill 40a may be carried out. Accordingly, the underfill 40a may reinforce the coupling of the wafer 20 and the package member 50. Furthermore, the filler may be added to the underfill 40a, so that the underfill 40a can reduce a difference in coefficient of thermal expansion between the wafer 20 and the package member 50. Therefore, the underfill 40a may improve the structural stability and reliability of the LED package.

Meanwhile, after the coupling, a rear surface of the first substrate 21 may be partially removed by grinding, and thus, the first substrate 21 may become thin.

(Formation of Wavelength Converter 60)

Figure 4:
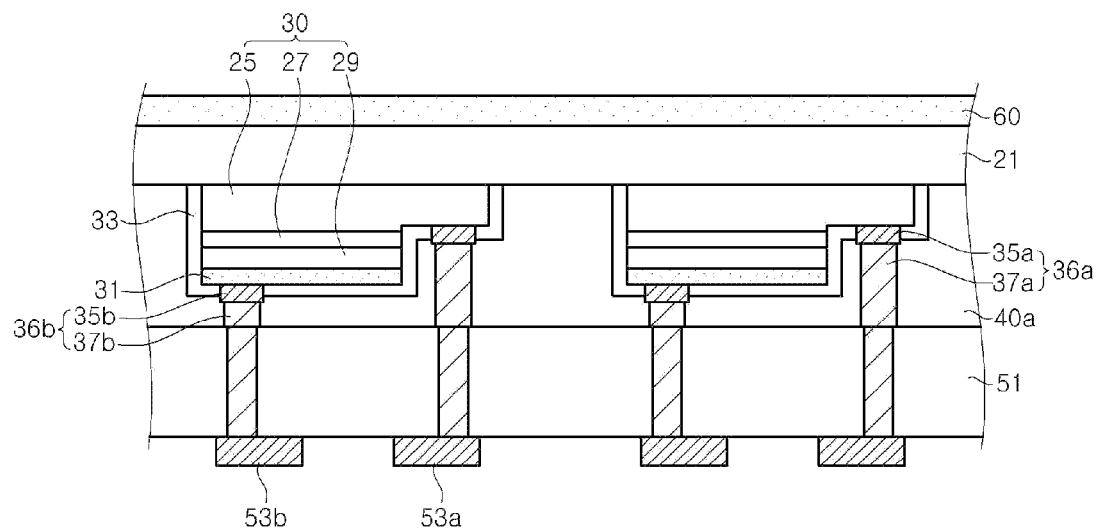

Referring to FIG. 4, after the coupling process is completed, a wavelength converter 60 is formed on the rear surface of the first substrate 21. The wavelength converter 60 may be formed by coating a phosphor or a phosphor-containing resin. For example, the phosphor-containing resin may be coated on the first substrate 21, and the wavelength converter 60 may be formed at a uniform thickness using a squeeze. Alternatively, a phosphor-containing wavelength converter, for example, a glass, may be attached to the first substrate 21. The glass may be attached to the first substrate 21 using an adhesive. Also, the glass may be attached to the first substrate 21 using a low-temperature direct bonding technique, without using an adhesive.

(Cutting Process)

Figure 5:
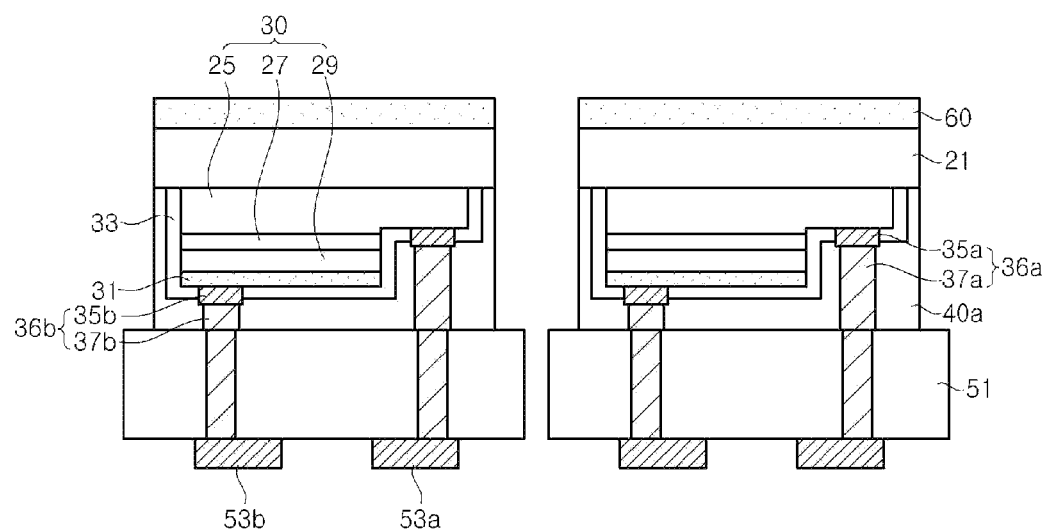

Referring to FIG. 5, the first substrate 21 and the second substrate 51 are cut. In a case where the underfill 40a is formed, the underfill 40a is also cut. The first substrate 21 and the second substrate 51 may be cut by scribing, braking, sawing, grinding, or laser. As a result, the fabrication of individual LED packages is completed.

The first substrate 21 and the second substrate 51 may be cut using a laser in the same process. Accordingly, the first substrate 21 and the second substrate 51 may be formed to have substantially the same size; however, the invention is not limited thereto. After the first substrate 21 is cut, the second substrate 51 may be cut through a separate process. In this case, as illustrated in FIG. 5, the first substrate 21 may be slightly smaller in size than the second substrate 51.

Figure 6:
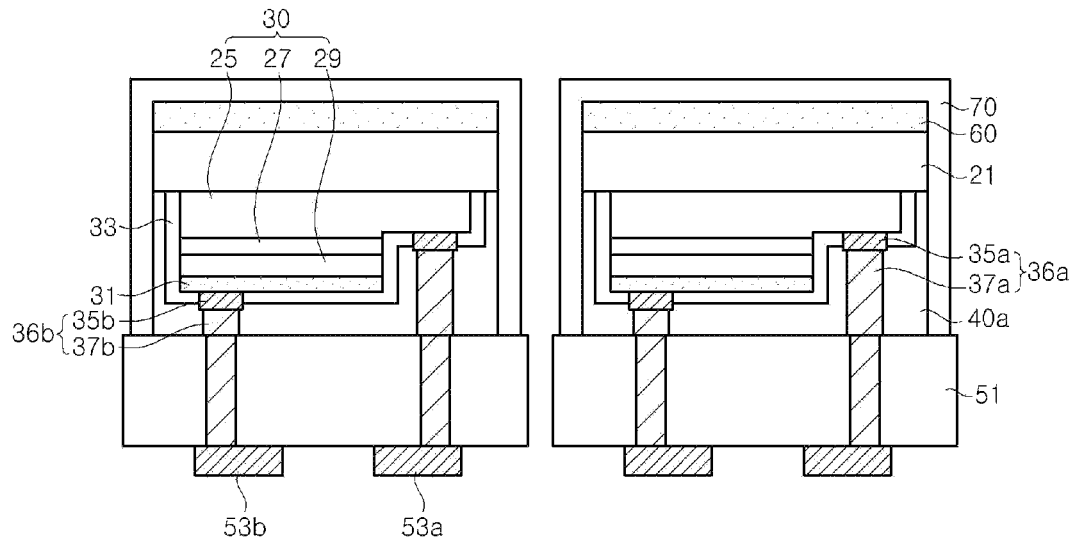

Meanwhile, phosphor characteristics of the phosphor-containing wavelength converter 60 are easily changed by moisture penetrated from the outside. In particular, in a case where the wavelength converter 60 is formed of a silicone resin, it is necessary to protect the silicone resin and the phosphor from moisture penetrated from the outside. To this end, as illustrated in FIG. 6, a moisture barrier coating 70 may be formed to cover the wavelength converter 60.

Before the cutting of the first substrate 21, the moisture barrier coating 70 may be formed on the first substrate 21 to cover the wavelength converter 60. Thereafter, the moisture barrier coating 70 may be cut together with the first substrate 21. Alternatively, the moisture barrier coating 70 may be formed after the cutting of the first substrate 21 and the underfill 40a, or may be formed after the cutting of the second substrate 51. Therefore, the moisture barrier coating 70 covers the wavelength converter 60 and the lateral side of the underfill 40a, thereby preventing moisture from penetrating from the outside into the LED package.

Figure 7:
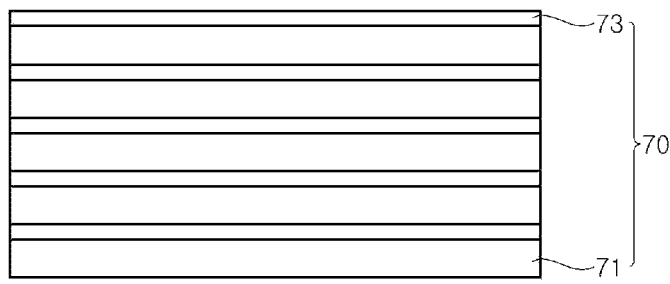

For example, the moisture barrier coating 70 may include a silicon oxide film or a silicon nitride film. As illustrated in FIG. 7, the moisture barrier coating 70 may be formed by alternately laminating an organic material layer 71 and an inorganic material layer 73. For example, the moisture barrier coating 70 may be formed by alternately laminating a transparent polymer and an oxide or nitride of a metal such as silicon (Si) or aluminum (Al) using a low-temperature vacuum deposition. The moisture barrier coating 70 lengthens a moisture penetration path to prevent moisture from penetrating into the wavelength converter 60.

According to this exemplary embodiment, since the plurality of semiconductor stacks 30 are mounted on the package member 50 at a wafer level, a fabrication process may be simplified and a fabrication cost may be reduced, as compared to a conventional fabricating process which mounts individual chips. Furthermore, in a package fabricating process according to the exemplary embodiment, it is unnecessary to electrically connect the lead electrodes to the semiconductor stacks using bonding wires. Therefore, it may be possible to avoid a package failure caused by breakage or shorting of bonding wires.

Although it has been described above that the underfill 40a is formed to cover the plurality of semiconductor stacks 30 before the bonding of the wafer 20 and the package member 50, the underfill 40a may not be needed in all aspects. Moreover, after the coupling of the wafer 20 and the package member 50, the underfill 40a may be formed by injecting an underfill material into a gap between the first substrate 21 and the second substrate 51.

FIGS. 8 to 12 are cross-sectional views illustrating a method of fabricating an LED package according to another exemplary embodiment of the present invention.

Figure 8:
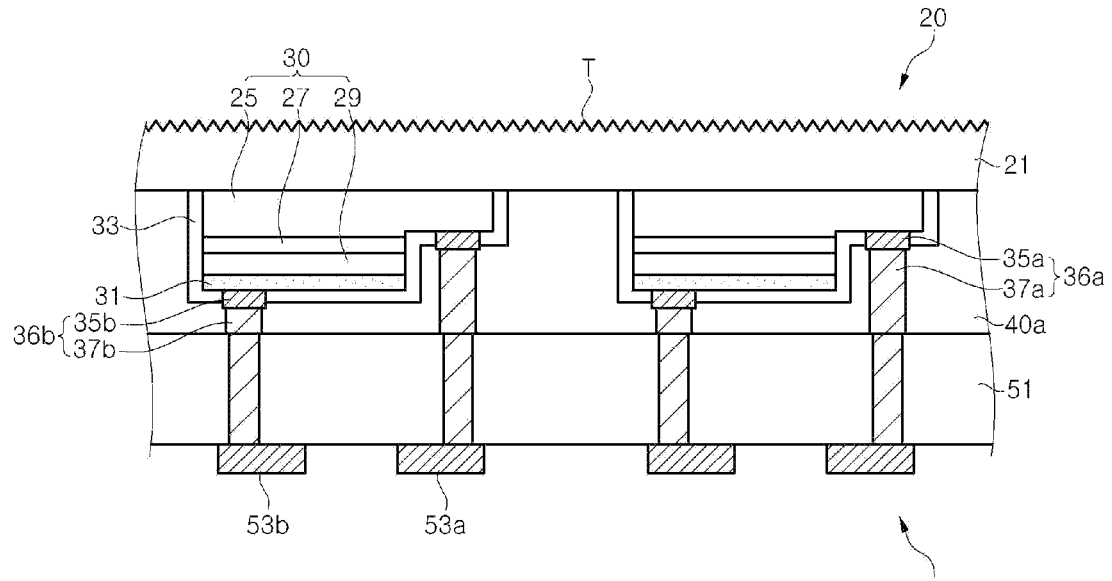
FIG. 8, FIG. 9, FIG. 10, FIG. 11, and FIG. 12 are cross-sectional views illustrating a method of fabricating an LED package according to another exemplary embodiment of the present invention.

Referring to FIG. 8, a wafer 20 and a package member 50 are prepared and coupled to each other, as described above with reference to FIGS. 1 to 3. Thereafter, a surface texture T is formed on a rear surface of the first substrate 21. The surface texture T may be formed by etching the first substrate 21 using wet etching, electron beam lithography, or nano implant technique. For example, the surface texture T may be formed with patterns having a pitch ranging from tens of nanometers to several micrometers and having an aspect ratio of 1 or more. The surface texture T may improve a light extraction efficiency of light emitted from the semiconductor stacks 30.

Figure 9:
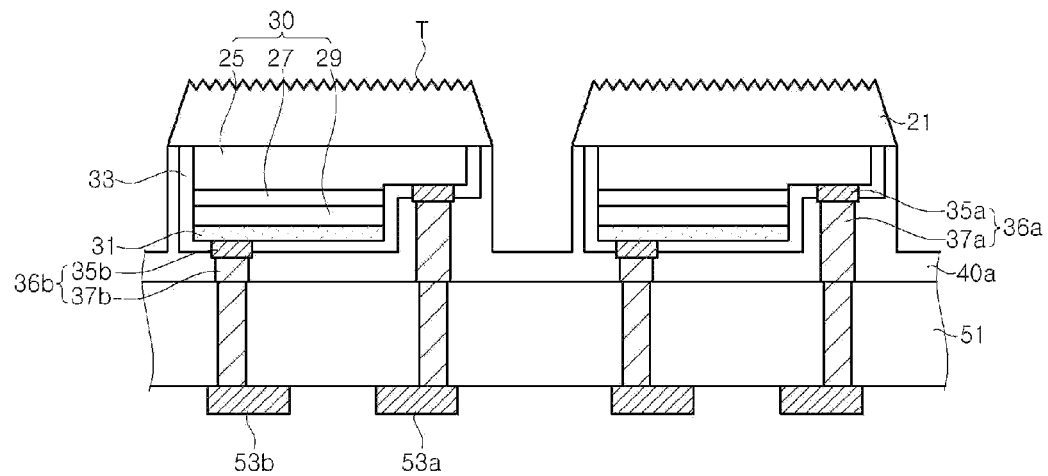

Referring to FIG. 9, the first substrate 21 is cut. The first substrate 21 may be cut to have an inverted triangular cross-section by using a diamond blade or a laser. Therefore, as illustrated in FIG. 9, in the cut region, the lateral side of the first substrate 21 may be formed to be inclined with respect to a vertical direction of the rear surface of the first substrate 21. The inclined lateral side of the first substrate 21 may improve a light extraction efficiency of light emitted from the semiconductor stacks 30.

Meanwhile, an underfill 40a under the cut region may be partially removed. The underfill 40a may be removed such that a portion thereof remains on the second substrate 51; however, the invention is not limited thereto. The underfill 40a may be removed such that the surface of the second substrate 51 is exposed.

Figure 10:
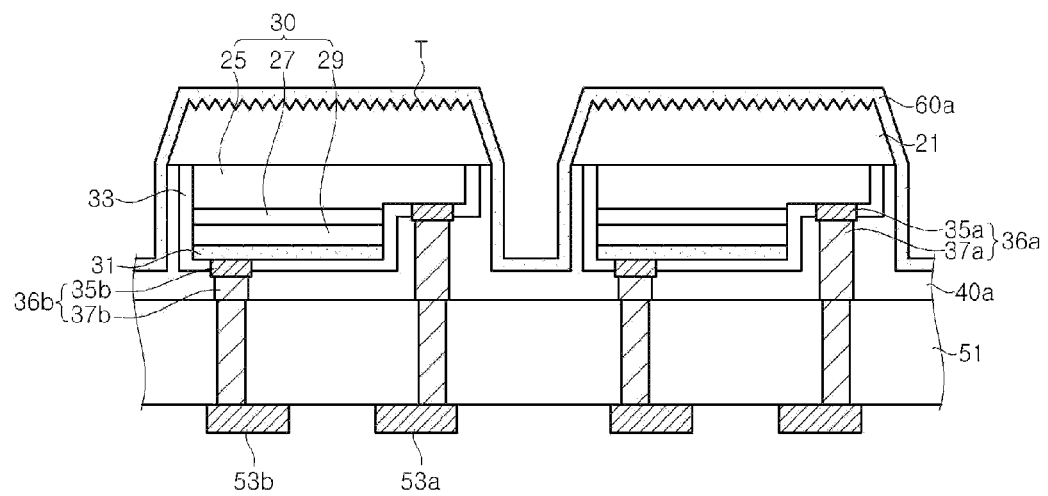

Referring to FIG. 10, a wavelength converter 60a covering the first substrate 21 is formed. The wavelength converter 60a may be formed of a phosphor-containing resin. The wavelength converter 60a covers the rear surface and the lateral side of the first substrate 21, and also covers the lateral side of the underfill 40a exposed within the cut region.

Figure 11:
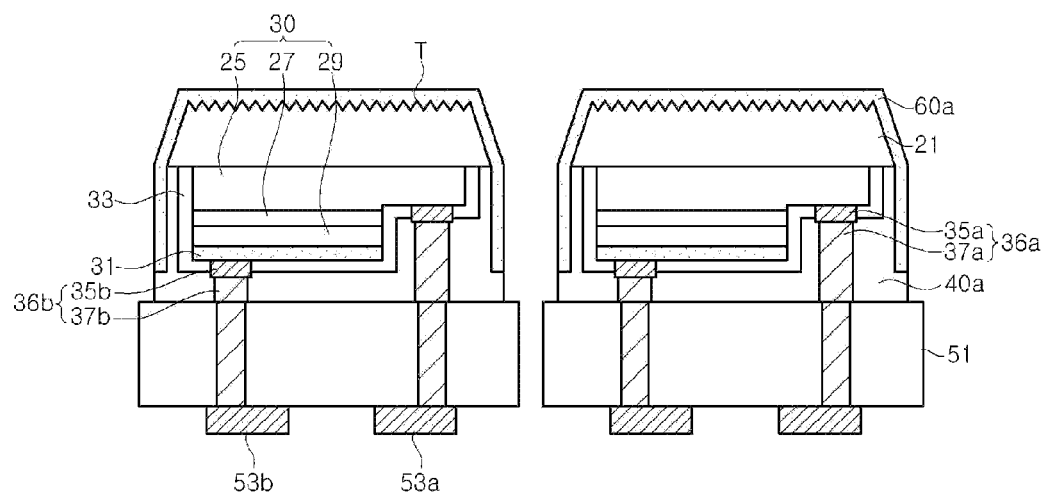

Referring to FIG. 11, the second substrate 21 is cut, and therefore, the fabrication of individual LED packages is completed. The wavelength converter 60a and the remaining underfill 40a under the cut region may also be cut.

Figure 12:
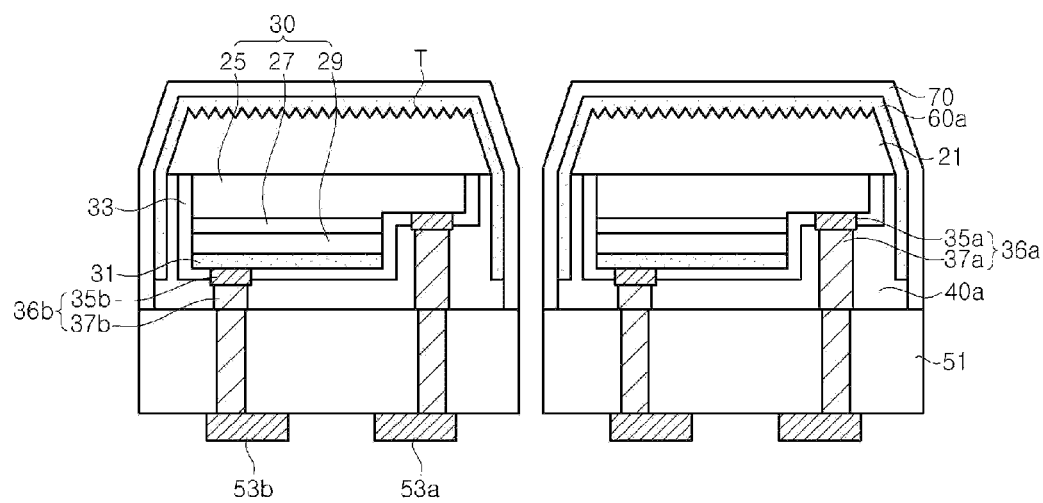

Referring to FIG. 12, a moisture barrier coating 70 may be additionally formed for preventing moisture from penetrating into the wavelength converter 60a, as described above with reference to FIG. 6. For example, the moisture barrier coating 70 may be formed after the removal of the wavelength converter 60a and the remaining underfill 40a under the cut region. The moisture barrier coating 70 may be formed before or after the cutting of the second substrate 51.

According to this exemplary embodiment, the light extraction efficiency may be improved by forming the surface texture T on the rear surface of the first substrate 21. In addition, the light extraction efficiency may be further improved by cutting the first substrate 21 such that the lateral side of the first substrate 21 is inclined. The technique for forming the surface texture T and forming the inclined lateral side is not limited to this embodiment, but may be equally applied to other embodiments.

Meanwhile, in this exemplary embodiment, since the wavelength converter 60a is formed after the partial removal of the first substrate 21 and the underfill 40a, the wavelength converter 60a may be formed to cover the lateral sides of the semiconductor stacks 30.

FIGS. 13 to 16 are cross-sectional views illustrating a method of fabricating an LED package according to another exemplary embodiment of the present invention.

Figure 13:
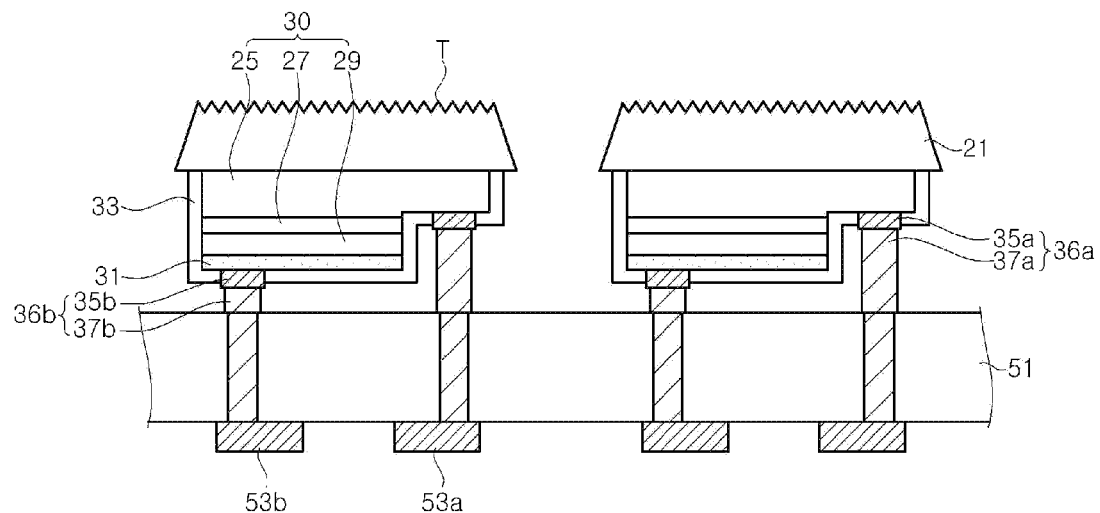
FIG. 13, FIG. 14, FIG. 15, and FIG. 16 are cross-sectional views illustrating a method of fabricating an LED package according to another exemplary embodiment of the present invention.

Referring to FIG. 13, after the wafer 20 is coupled to the package member 50, the surface texture T is formed on the rear surface of the first substrate 21, and the first substrate 21 is cut such that the lateral side thereof is inclined, as described above with reference to FIGS. 8 and 9. However, in this embodiment, the process of forming the underfill 40a in the wafer preparing step is skipped, as opposed to the previous exemplary embodiments.

Figure 14:
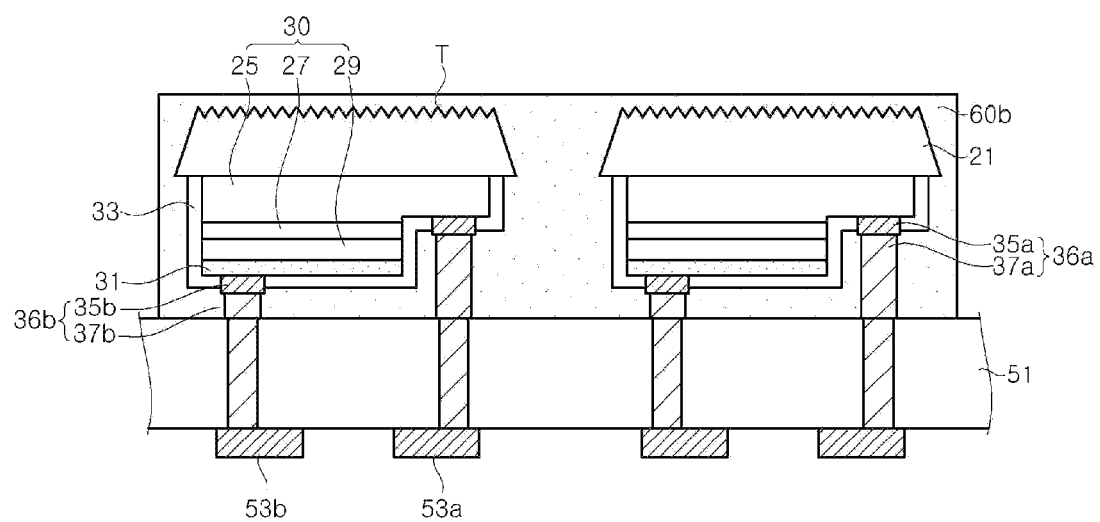

Referring to FIG. 14, a wavelength converter 60b covering the cut first substrate 21 is formed. In addition, the wavelength converter 60b may fill a gap between the first substrate 21 and the second substrate 51. That is, the underfill 40a may also be formed using the wavelength converter 60b. The wavelength converter 60b may be formed of a phosphor-containing resin. Alternatively, the wavelength converter 60b may be formed on the first substrate 21 at a uniform thickness by using a squeeze.

Figure 15:
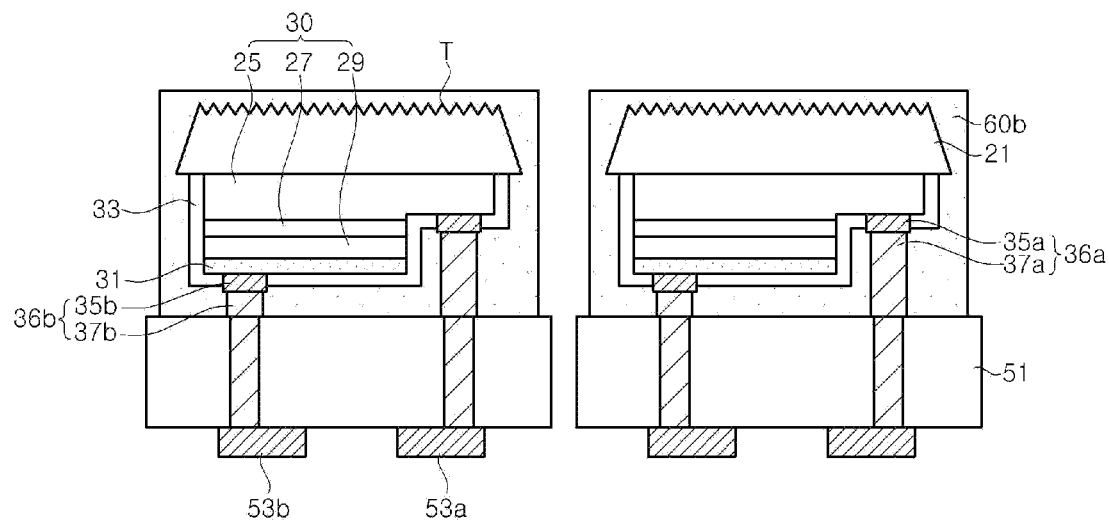

Referring to FIG. 15, the second substrate 51 is cut, and therefore, the fabrication of individual LED packages is completed. The wavelength converter 60b disposed within the cut region of the first substrate 21 may also be cut.

Figure 16:
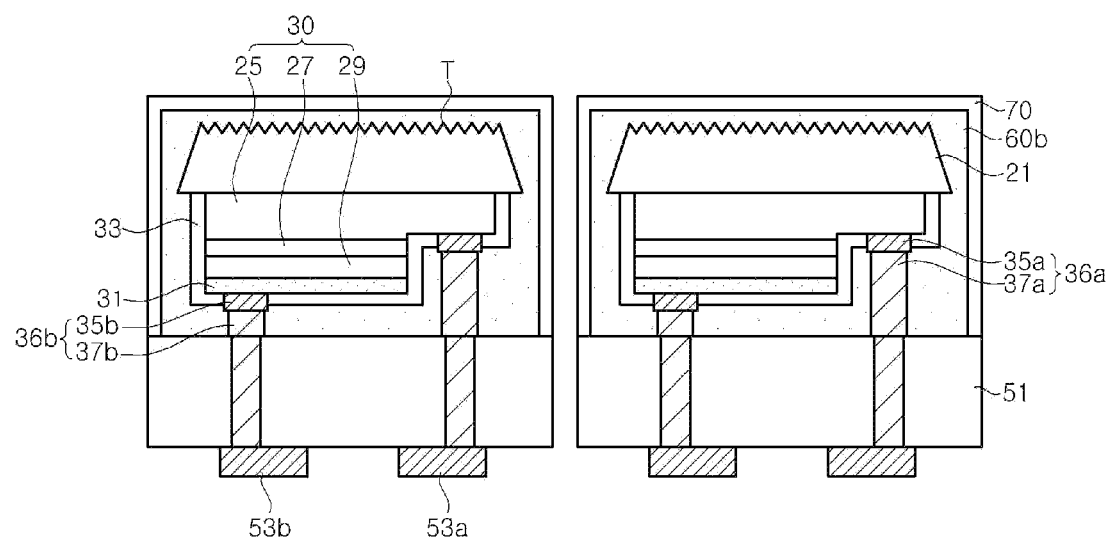

Referring to FIG. 16, a moisture barrier coating 70 may be additionally formed for preventing moisture from penetrating into the wavelength converter 60b, as described above with reference to FIG. 6. For example, after the wavelength converter 60b under the cut region is removed, the moisture barrier coating 70 may be formed to cover the wavelength converter 60b. The moisture barrier coating 70 may be formed before or after the cutting of the second substrate 51.

According to the exemplary embodiments of the present invention, the plurality of semiconductor stacks formed on the first substrate are coupled to the second substrate at a wafer level, and the first substrate and the second substrate are cut to fabricate the LED packages. Therefore, the chip bonding process may be simplified and the working time may be considerably reduced. Furthermore, since the LED packages are fabricated at a wafer level, it is suitable for package miniaturization. Moreover, the underfill may improve the bonding force of the first substrate and the second substrate. Therefore, the structurally stable LED packages may be provided. By forming the moisture barrier layer, it may be possible to prevent moisture from penetrating from the outside into the LED package.

In addition, mixed color light, particularly white light, may be realized using the wavelength converter. Using the underfill and/or the wavelength converter, the wavelength conversion may be performed on light emitted toward the lateral sides and bottom surfaces of the semiconductor stack, as well as the top surfaces thereof.

While the exemplary embodiments of the present invention have been described with reference to the specific embodiments, it will be apparent to those skilled in the art that various changes and modifications may be made without departing from the spirit and scope of the invention. Thus, it is intended that the present invention cover the modifications and variations of this invention provided they come within the scope of the appended claims and their equivalents.

What is claimed is:

1. A light emitting diode (LED) package, comprising:
   a first substrate;
   a semiconductor stack disposed on a front surface of the first substrate, the semiconductor stack comprising a first semiconductor layer, a second semiconductor layer, and an active layer disposed between the first semiconductor layer and the second semiconductor layer;
   a second substrate comprising a first lead electrode and a second lead electrode;
   a plurality of connectors electrically connecting the semiconductor stack to the first and second lead electrodes; and
   a wavelength converter covering a rear surface of the first substrate.

2. The LED package of claim 1, further comprising:
   an underfill disposed between the first substrate and the second substrate.

3. The LED package of claim 2, wherein the underfill comprises at least one of a phosphor and a filler.

4. The LED package of claim 2, wherein the wavelength converter covers at least a portion of a lateral side of the underfill.

5. The LED package of claim 4, further comprising:
   a moisture barrier coating covering the wavelength converter.

6. The LED package of claim 5, wherein the moisture barrier coating covers a lateral side of the underfill.

7. The LED package of claim 1, further comprising:
   a moisture barrier coating covering the wavelength converter.

8. The LED package of claim 7, wherein the moisture barrier coating comprises an organic material layer and an inorganic material layer alternately laminated.

9. The LED package of claim 7, wherein the wavelength converter fills a gap between the first substrate and the second substrate.

10. The LED package of claim 1, wherein the wavelength converter comprises a phosphor-containing glass.

11. The LED package of claim 10, wherein the glass is directly on the rear surface of the first substrate.

12. The LED package of claim 1, wherein a rear surface of the first substrate is textured.

13. The LED package of claim 1, wherein a lateral side of the first substrate is inclined with respect to a vertical direction of the rear surface of the first substrate.

* * * * *